United States Patent [19]

Marshall

[11] Patent Number: 4,488,119

[45] Date of Patent: Dec. 11, 1984

[54] FM DEMODULATOR

[75] Inventor: Christopher B. Marshall, Harpenden, England

[73] Assignee: U.S. Philips Corporation, New York, N.Y.

[21] Appl. No.: 345,863

[22] Filed: Feb. 4, 1982

[30] Foreign Application Priority Data

Feb. 20, 1981 [GB] United Kingdom ................ 8105456

[51] Int. Cl.³ .............................................. H03D 3/00
[52] U.S. Cl. ..................................... 329/50; 329/122;
329/124; 455/214; 455/337
[58] Field of Search ................... 455/214, 337; 329/50,
329/122, 124; 328/25

[56] References Cited

U.S. PATENT DOCUMENTS

| | | | |
|---|---|---|---|
| 3,035,231 | 5/1962 | Neelands et al. | 455/337 X |
| 3,101,448 | 8/1963 | Costas | 329/50 |
| 3,500,217 | 3/1970 | Allen | 455/214 X |
| 3,609,555 | 9/1971 | Van Blerkom et al. | 455/214 X |
| 4,145,663 | 3/1979 | Yahata et al. | 455/214 X |
| 4,253,067 | 2/1981 | Caples et al. | 455/214 X |
| 4,270,221 | 5/1981 | Daniel, Jr. | 329/124 X |

Primary Examiner—Siegfried H. Grimm
Assistant Examiner—D. C. Mis
Attorney, Agent, or Firm—Joseph P. Abate

[57] ABSTRACT

An FM demodulator in which an incoming FM signal ($2a \sin(\omega + \delta\omega)t$) is demodulated to baseband ($\delta\omega$) by applying it to first and second mixers (12, 14). The output ($b \sin \omega t$) of a local oscillator (16) is applied to one (14) of the mixers and is also applied to the other (12) of the mixers via a 90° phase shifter (18). The phase of the output of one of the mixers is shifted so as to be in phase or in antiphase to the other and is applied together with the output of the other of the mixers to a signal divider (22), the output of which comprises the baseband signal which is substantially independent of fading.

1 Claim, 3 Drawing Figures

FM DEMODULATOR

BACKGROUND OF THE INVENTION

The present invention relates to FM (frequency modulation) demodulator. More particularly, the present invention relates to a FM demodulator in which the use of inductors for filtering is avoided an the output signal is substantially independent of fading. This independence is particularly useful in mobile receiver applications in which the strength of an input signal can vary quite rapidly.

It is known to demodulate frequency-modulated signals by a method which involves sampling in some way. However, a disadvantage of this method is that when the signal has been mixed down to audio frequencies, the sampling produces harmonics which lie in the audio band and cause distortion.

There also exists a number of proposals for demodulating FM signals which proposals do not involve sampling. British Patent Specification No. 1,530,602 discloses a demodulator comprising first and second parallel arranged signal paths whose inputs are connected to receive an incoming FM signal and whose outputs are connected to a difference amplifier. Each of the first and second signal paths comprises a first mixer having an output connected to a low pass filter whose output is in turn connected via an automatic level control (ALC) amplifier to one input of a second mixer the output of which is connected to a respective input of the difference amplifier. A first signal input to the first mixer in each path is the incoming FM signal. A second signal input of the first mixer in the second path is a reference signal and the second signal input of the first mixer in the first path is the same reference signal which has been phase shifted by 90°. The outputs of the first mixers are the sum and difference components of mixing. The low pass filter in each path passes the difference components, namely a cos δωt in the first path and a sin δωt in the second path, where 2α is the amplitude of the input signal, δω is the angular frequency difference component and the amplitude of a signal from a local oscillator is unity. The ALC amplifiers enable the signals processed thereafter to have a standard level of signal with which to work and enable the receiver to have a large working range signal.

The output signals from the ALC amplifiers are supplied to a first signal input of the second mixer in its respective signal path and to respective differentiators which differentiate their respective signals to give terms with amplitude/frequency slope and a quadrature phase shift. The output of the differentiator whose input is connected to the first path is connected as a second signal input to the second mixer in the second path; conversely, the output of the other differentiator is connected as a second signal input to the second mixer of the first path. The signals applied to the inputs of the difference amplifier comprise a²δω cos² δωt from the first path and −a²δω sin² δωt from the second path and the output from the difference amplifier is a²δω. Since this output comprises a power term, namely a², then the output is dependent on the amplitude of the input signal which may vary considerably and rapidly if the demodulator is part of a mobile receiver.

Also known is a sine-cosine frequency tracker which is disclosed in British Patent Specification No. 1,363,396. The frequency tracker includes a frequency discriminator which is very similar to the demodulator of British Patent Specification No. 1,530,602 but in which there are no ALC amplifiers. The output from a difference amplifier is A²ω where A is the amplitude of the input signal and ω is the difference signal between the incoming signal and a reference derived from a sweep oscillator. In the case of the tracking system, the A²ω term is required in order to provide a control signal for the sweep oscillator.

U.S. Pat. No. 3,568,067 also discloses a frequency discriminator which is very similar to that disclosed in British Patent Specification No. 1,363,396. This too produces an output which is amplitude dependent.

SUMMARY OF THE INVENTION

An object of the present invention is to provide an FM demodulator in which amplitude and sinusoidal variations are reduced or eliminated.

According to the present invention there is provided a FM demodulator in which an input signal and a local oscillator signal are mixed in two mixers to provide outputs which are in quadrature phase relationship with each other, a low frequency output of one of the two mixers is phase shifted, as described in the next paragraph, by 90° more than the phase shift in a low frequency output of the other of the two mixers to render the two signals in phase or antiphase with each other, and in which the two signals are applied to a divider to obtain as an output a modulating signal contained in the input signal.

The phase shifting of one of the first and second mixing operations may be accomplished by differentiating or integrating the signal from said one mixer or by using a pair of phase shifting networks, one in each channel if only the sign of δω is to be determined or resolved, for example, as may be the case in data transmission.

An advantage of the demodulator in accordance with the present invention is that it enables demodulation to be carried out at baseband due to its continuity (that is because there is no sampling) and it is resistant to the effects of fading.

The quadrature mixing of the input signal and the local oscillator signal is enabled by shifting the phase of one or another of these signals by 90° prior to its being applied to one of the two mixers.

An embodiment of a demodulator made in accordance with the present invention comprises a signal input, first and second mixers each having first and second inputs, said first inputs being connected to the signal input, means for producing a first local oscillator signal which is supplied to the second input of the first mixer, means for producing a second local oscillator signal which is of the same frequency as, and shifted in phase by 90° relative to, the first local oscillator signal and supplying it to the second input of the second mixer, a divider having first and second inputs and an output constituting a signal output, the first input being connected to receive a low frequency output of one of the first and second mixers, and the second input being connected to receive a low frequency output of the other of the first and second mixers which has been shifted in phase by 90° relative to the phase of the signal applied to the first input, thus making the applied signals in phase or in antiphase.

The divider comprises a multiplier in a feedback arrangement. In the case of an analogue multiplier, means are provided for inverting the polarity of the input signal forming the denominator in order to keep it positive.

In an embodiment of the present invention, a further low pass filter is connected in the signal path from each of the first and second mixers to remove adjacent channel interference.

If desired, automatic gain control means are provided in at least one signal path from one of the first and second mixers.

BRIEF DESCRIPTION OF THE DRAWING

Embodiments of the present invention will now be described, by way of example, with reference to the accompanying drawings, wherein.

DESCRIPTION OF THE PREFERRED EMBODIMENTS

Figure 1:
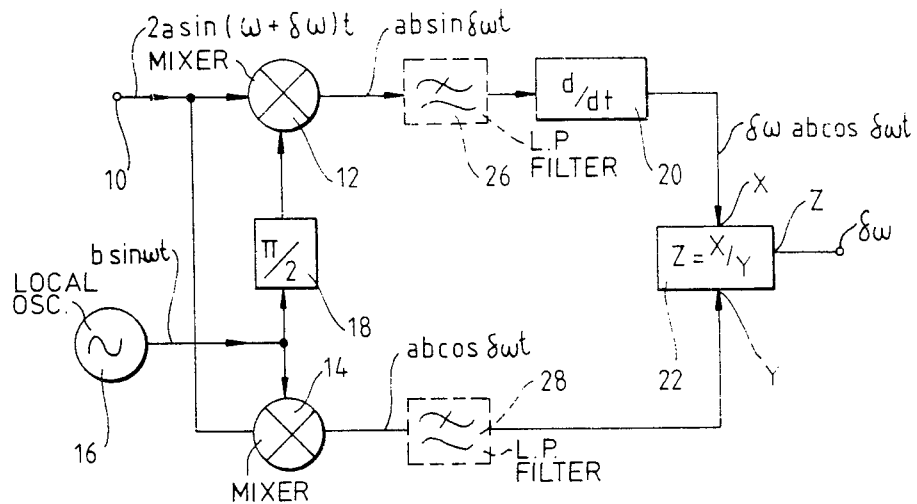
FIG. 1 is a block diagram of one embodiment of the present invention.

Referring to FIG. 1, an input FM signal $2a \sin(\omega+\delta\omega)t$ is applied to a first signal input of first and second mixers 12, 14, respectively, via an input terminal 10. A signal generator or local oscillator 16 produces a signal, $b \sin \omega t$, having a frequency corresponding to the carrier wave of the input signal. This local oscillator signal is applied to a second signal input of the second mixer 14, and is applied to a phase shifter 18 which shifts the phase of this signal by 90°. The phase shifted signal is applied to a second input of the first mixer 12. The mixers 12, 14 which may include low pass filters produce outputs at base band frequency, in the case of the first mixer 12 the output can be represented by $ab \sin \delta\omega t$ and in the case of the second mixer 14 the output can be represented by $ab \cos \delta\omega t$. Both these signals will contain amplitude and sinusoidal variations. These variations can be reduced and/or eliminated using a divider 22. In order to do this, the phase of one of the signals has to be shifted by 90° in order to render it in phase or antiphase with the other signal. In FIG. 1, this is done by applying the output, $ab \sin \delta\omega t$, of the first mixer 12 to a differentiation circuit 20, the output of which, $\delta\omega \cdot ab \cos \delta\omega t$, is applied to an input X of the divider 22. A second input Y of the divider receives the output, $ab \cos \delta\omega t$, from the second mixer 14. The divider carries out the operation X/Y (i.e. $\delta\omega \cdot ab \cos \delta\omega t/ab \cos \delta\omega t$) to give an output signal $\delta\omega$ on the output Z of the divider 22. The output signal $\delta\omega$ corresponds to the modulation component of the input signal applied to the terminal 10 and is independent of amplitude a. Consequently, the effects of fading on the output signal are reduced.

Figure 2:
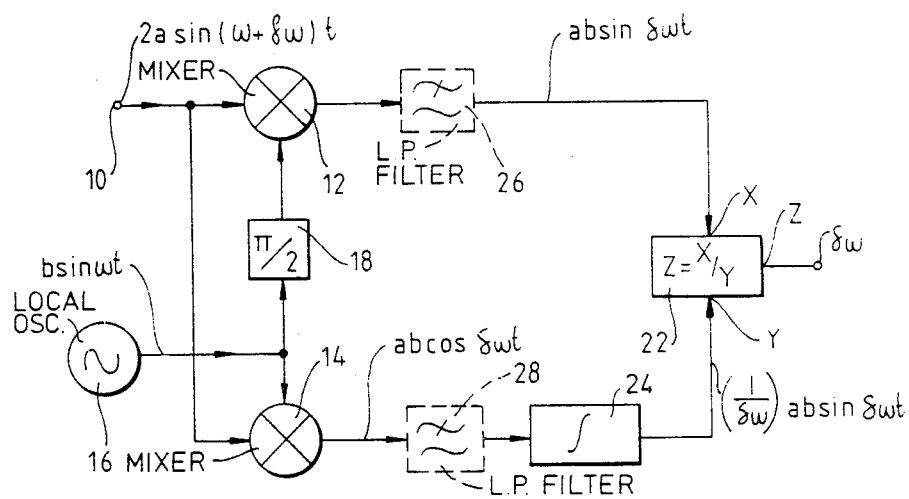
FIG. 2 is a block diagram of another embodiment of the present invention.

The embodiment shown in FIG. 2 differs from the embodiment of FIG. 1, by the fact the connections from the mixers 12, 14 to the inputs X, Y, of the divider 22 are different. The input X of the divider 22 comprises the output $ab \sin \delta\omega t$ from the mixer 12. The output $ab \cos \delta\omega t$ of the mixer 14 is integrated in an integrator 24 to provide a 90° phase shift having an output $(1/\delta\omega) \cdot ab \sin \delta\omega t$. This comprises the input Y to the divider. The output Z of the divider 22 again comprises $\delta\omega$.

In the embodiments illustrated in FIGS. 1 and 2, if the circuit components in the signal paths do not provide low pass filtering to select the difference products of mixing then separate low pass filters 26, 28, shown in broken lines, should be coupled to the outputs of the mixers 12, 12, respectively.

Figure 3:
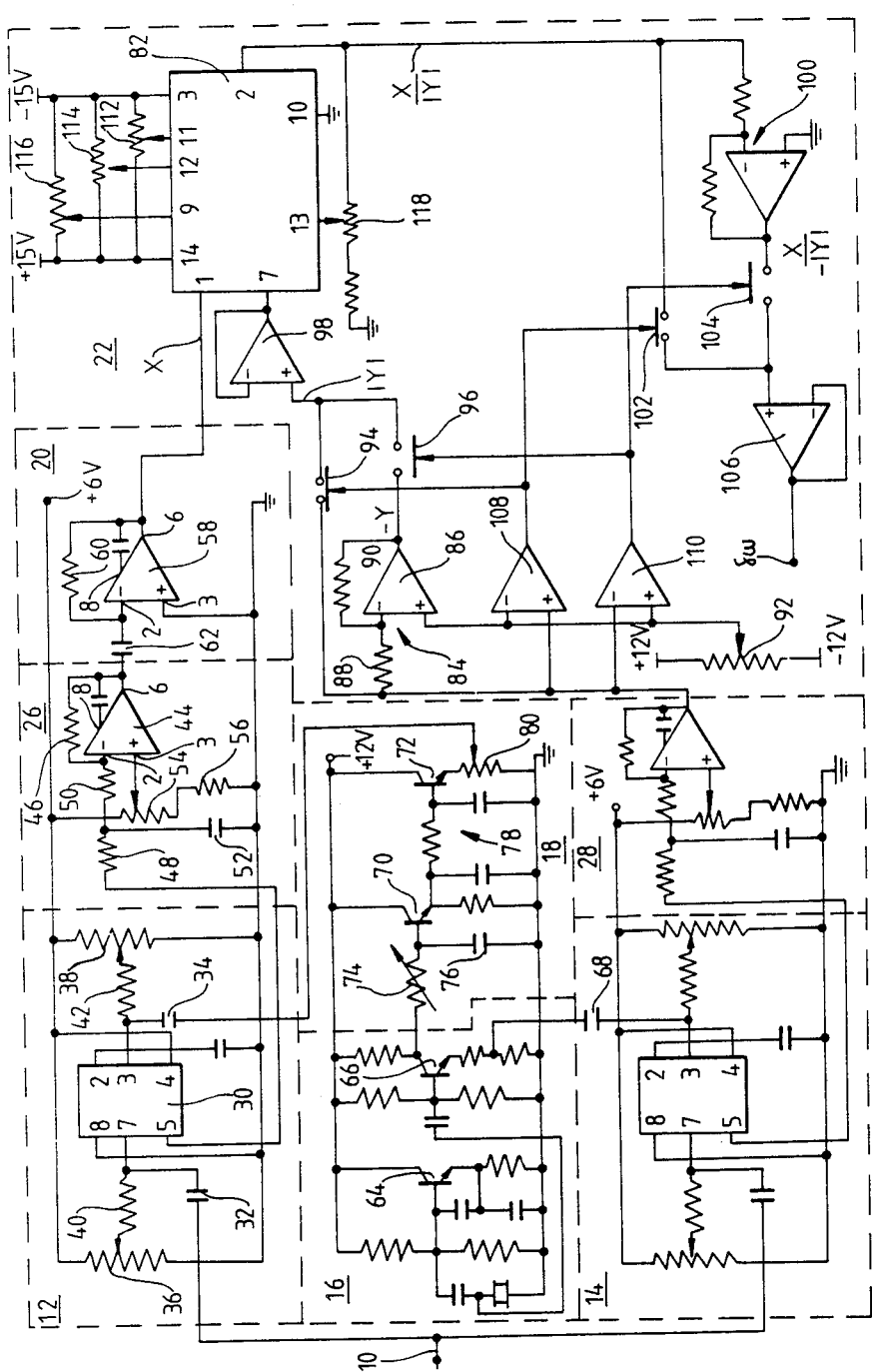
FIG. 3 is a schematic circuit diagram of an embodiment of the type shown in FIG. 1.

Referring now to FIG. 3, there is shown a schematic circuit diagram of an embodiment of the type shown in FIG. 1 which uses a differentiator. For the sake of consistency and ease of explanation, the main elements of the circuit have been enclosed in broken lines and identified by the same reference numerals as used in FIG. 1. Two low pass filters 26 and 28 are connected between the mixer 12 and the differentiator 20 and between the mixer 14 and the divider 22, respectively. These filters 26, 28 serve to filter out the high frequency image component and other unwanted signals in the outputs of the mixers 12 and 14.

In the following description, since the mixers 12, 14 and low pass filters 26, 28 are identical, only the mixer 12 and the filter 26 will be described in detail. The mixer 12 comprises a multiplier type SL 640C integrated circuit 30, the pin numbers of which are shown within the rectangle. The input terminal 10 is connected to the pin 7 by way of a capacitor 32 having a value 2n7 farads. The output of the phase shifter 18 is connected to a pin 3 by way of a capacitor 34 having a value of 4n7 farads. The pins 3 and 7 are biased from a +6 volt rail by means of 10KΩ potentiometers 36, 38 and 330KΩ resistors 40, 42, respectively. The signal output of the mixer 12 is derived from the pin 5 of the integrated circuit 30. The other connections of the integrated circuit 30 are as shown and the value of the capacitor between pin 2 and ground is 10 μF.

The low pass filter 26 is based on an operational amplifier 44, for example amplifier type 531, having negative feedback via 27KΩ resistor 46. The relevant pins of the type 531 amplifier are shown within the triangular symbol representing the amplifier. A capacitor of 47 pF is connected between a pin 8 on the amplifier 44 and its output. The output, pin 5, of the mixer 12 is connected to the inverting input, pin 2, of the amplifier 44 via an R.C. filter network comprising series connected resistors 48 (4K7) and 50 (2K7) and a capacitor 52 (3n3F) connected between a junction of the resistors 48, 50 and ground. The non-inverting input, pin 3, of the amplifier is biased using a potentiometer 54 (4K7) and a series resistor 56 (10K) connected between the 6 volt rail and ground.

The differentiator 20 is based on another operational amplifier 58, for example, amplifier type 531. As is customary there is a feedback resistor 60 (5K6) connected between the amplifier output, pin 6, and the inverting input, pin 2, of the amplifier 58, which input is connected to the output of the filter 26 by way of a capacitor 62 (10 μF). A non-inverting input, pin 3, of the amplifier 58 is connected to ground. A capacitor of 220 pF is connected between pin 8 on the amplifier 58 and its output.

As the oscillator 16 is a standard crystal oscillator circuit based on an npn transister 64 type BF 494, it will not be described further. The output of the oscillator is connected to a phase splitting arrangement comprising an npn transistor 66, type BF 494. As such an arrangement is well-known, it will not be described further. The non-inverted signal is tapped-off from the emitter circuit of the transistor 66 and is applied by way of a capacitor 68 (4n7) to pin 3 of the integrated circuit in the mixer 14. The inverted signal is derived from the collector of the transistor 66 and applied to the phase shifter 18 which adjusts the phase of the signal by 90°.

The phase shifter 18 comprises two npn transistors 70, 72, type BF 494, which are operated as emitter followers. The inverted signal from the phase splitting arrangement is applied to the base electrode of the transistor 70 by way of an R.C. phase balancing network comprising a series variable resistor 74 (470Ω) and a capacitor 76 (100 pF) coupled to ground. An R.C. filter 78 couples the emitter of the transistor 70 to the base of the transistor 72. The 90° phase shifted signal is derived from the tap of a potentiometer 80 in the emitter circuit of the transistor 72 and is applied via the capacitor 34 to pin 3 of the integrated circuit 30. The potentiometer 80 provides amplitude balance to the derived signal.

The output of the differentiator 20 comprises the signal X which is applied as one input to the divider 22 and the output of the low pass filter 28 comprises the signal Y which is applied as another input to the divider 22. In the illustrated embodiment, the divider 22 is based on an analogue divider 82, for example, an Analog Devices AD 533D, the pin numbers of which are shown within the rectangle. Such a divider 82 goes unstable when the denominator input is negative and, accordingly, it is necessary to take steps to invert the polarity of the denominator signal when it goes negative and then reinsert the correct polarity afterwards.

In order to do this, the signal Y is applied to an inverter 84 based on an operational amplifier 86, for example, an amplifier type 741. The signal Y is applied to the inverting input of the amplifier 86 by way of a 4K7 resistor 88. Since the overall gain is unity, then a 4K7 resistor 90 is used to apply negative feedback. The non-inverting input of the amplifier 86 is biased using a potentiometer 92, the bias being set at on or about zero volts. Analogue switches 94, 96, for example, HEF 4066, are actuated as appropriate to provide a positive signal |Y| at the non-inverting input of a buffer amplifier 98, for example, an operational amplifier type 741, the output of which is applied as an input to pin 7 of the divider 82, the signal X being supplied to the pin 1.

The quotient X/|Y| on pin 2 of the divider 82 has its polarity adjusted by means of another inverter 100 which is identical to the inverter 84. Selection of the quotient signal X/|Y| or the inverter quotient signal −X/|Y| to restore the correct polarity is done by analogue switches 102, 104. The outputs of these switches 102, 104 are applied to a buffer amplifier 106, for example, an amplifier type 741, from the output of which the desired signal δω is obtained.

The analogue switches 94 and 102 are controlled by the output of a comparator 108, type LM 339, the non-inverting input of which receives the signal Y and the inverting input of which is biased by the potentiometer 92. The analogue switches 96 and 104 are controlled by the output of a comparator 110, type LM 339, the inverting input of which receives the signal Y and the non-inverting input of which is biased by the potentiometer 92. By using the comparators 108, 110, the operation of the switches 94, 96, 102, 104 is speeded up because an inverter is not then required.

In order to try and ensure that the input d.c. levels are zero, it may be necessary to provide a number of potentiometers 112, 114 and 116 for adjustments of the integrated circuit comprising the multiplier 82. The amplitude of the quotient signal is adjustable by means of a gain control 118.

Dividing by zero can be problematic and can be avoided by disconnecting the output of the divider 82 for small amplitude inputs. This can be done in a variety of ways such as the inclusion of threshold circuits and gating of the output during divider denominator input zero crossings.

Although not shown in FIGS. 1 to 3, automatic gain control(s) may be inserted in one or both signal paths.

The filters 26, 28 should be high order, good rejection filters in order not to destroy the effect of filtering which could lead to a radio receiver including the described and illustrated demodulator receiving an adjacent channel.

If it is desired to carry out the division X/Y digitally, then it will be necessary to include analogue-to-digital converters to convert the analogue signals X and Y to digital form and a digital-to-analogue converter to restore the quotient to analogue form.

In a non-illustrated modification of the invention, the local oscillator 16 and the phase shifter 18 may be replaced by separate servo-controlled local oscillators with a phase difference of 90° between their outputs.

Further, the analogue divider may be replaced by a multiplier in a feedback arrangement.

Adjacent channel interference can be removed by connecting a further low pass filter in the signal path from each of the first and second mixers 12, 14. The rejection of adjacent signals when the wanted signal is small may be improved by making the numerator filter 26 of higher order than the denominator filter 28. In this case, an additional all-pass section should be incorporated into the denominator filter 28 so that the phase relationship between the two signal paths is preserved.

In the case of a data transmission system where it is important to resolve the sign of δω, only the demodulator is required to maintain a 90° relative phase shift between the low frequency outputs of the first and second mixers 12, 14, respectively, and, accordingly, provided that this relationship is maintained, the precise arrangement for achieving it is not important. Thus, a phase shift of θ can be provided in one signal path and a phase shift of (θ+π/2) can be provided in the other signal path.

If desired, instead of applying quadrature components of the local oscillator signals to the mixers 12, 14, the phase of the input signal applied to one of these mixers can be shifted by 90° and the local oscillator output applied to the mixers 12, 14 directly.

I claim:
1. A FM demodulator which comprises:
an input terminal for receiving a frequency-modulated input signal;
first and second mixers each having first and second inputs and each having an output, the first inputs of the mixers being connected to the input terminal;
first means for producing a first local oscillator signal;
second means for producing a second local oscillator signal having the same frequency as, and being phase shifted by 90° relative to, the first local oscillator signal, the second input of the second mixer being connected to the first means, the second input of the first mixer being connected to the second means;
a signal divider including a first input, a second input and an output which comprises an output of the demodulator, the first input of the divider being coupled to the output of the first mixer, and
an integrator coupled to the second input of the divider and to the output of the second mixer, so that a low frequency signal at the output of the second mixer is phase shifted in the integrator by 90° more than the phase of a low frequency signal at the output of the first mixer, the low frequency signals being applied to the divider, whereby a signal corresponding to a modulating signal of the input signal is obtained at the output of the divider.

* * * * *